United States Patent [19]
Min et al.

[11] Patent Number: 5,904,492
[45] Date of Patent: May 18, 1999

[54] QUANTUM WIRE LASER DIODE FABRICATION METHOD

[75] Inventors: Suk-Ki Min; Eun Kyu Kim, both of Seoul, Rep. of Korea

[73] Assignee: Korea Institute of Science and Technology, Rep. of Korea

[21] Appl. No.: 08/958,404

[22] Filed: Oct. 29, 1997

[30]   Foreign Application Priority Data

Oct. 30, 1996 [KR]   Rep. of Korea ................. 96-49916

[51] Int. Cl.$^6$ ................................. H01L 21/20
[52] U.S. Cl. ............................. 438/42; 438/43; 438/44; 438/47
[58] Field of Search ................... 438/22, 42, 43, 438/44, 46, 47, 962

[56]          References Cited

U.S. PATENT DOCUMENTS 5,114,877   5/1992   Paoli et al. .
5,518,955   5/1996   Goto et al. .
5,571,376   11/1996  Bestwick et al. .

OTHER PUBLICATIONS

T.G. Kim, et al., "Fabrication of V–Grooved Inner Stripe GaAs–AlGaAs Quantum–Wire Lasers", IEEE Photonics Technology Letters, vol. 9, No. 3, Mar. 1997, pp. 274–276.

T.G. Kim, et al., "V–Grooved GaAs/AlGaAs Quantum Wire Laser Array Confined By Junction–Isolation Stripes", Solid–State Electronics, vol. 41, No. 8, 1997, pp. 1079–1081.

Primary Examiner—Charles Bowers
Assistant Examiner—Keith Christianson
Attorney, Agent, or Firm—Ostrolenk, Faber, Gerb & Soffen, LLP

[57]          ABSTRACT

A quantum wire laser diode fabrication method includes the steps of forming a buffer layer and an epitaxial layer sequentially on a substrate, forming a V-grooved pattern into the epitaxial layer to form a current blocking layer, and forming another buffer layer thereon, forming a quantum wire laser structure on the V-grooved pattern, forming a contact layer, and forming an electrode. The fabrication method employs a current blocking layer formed outside the V-grooved pattern to interrupt the current from flowing thereinto, for thereby enabling the current to only flow into the active layer, without requiring any subsequent processes which allow the current to efficiently flow into the active layer, and further obtaining the low threshold current.

7 Claims, 3 Drawing Sheets

QUANTUM WIRE LASER DIODE FABRICATION METHOD

BACKGROUND OF THE INVENTION

1. Field of the Invention

The present invention relates to a quantum wire laser diode, and more particularly to an improved quantum wire laser diode fabrication method capable of obtaining a low threshold current by enhancing the efficiency of a current flow into a quantum wire laser activation layer.

2. Description of the Prior Art

In general, quantum wire laser diodes having a low threshold current are known to be advantageous in a circuit integrated with a low power electrical device such as an optical computer or an optical signal processor, and its adaptability to a low temperature, and a high frequency modulating characteristic makes it possible to serve as an optical source in communication devices. Due to such advantages, studies have been on going to fabricate high quality quantum wire laser diodes in recent years. In particular, the quantum wire laser diodes formed in a V-grooved substrate change the substrate direction and growth conditions, for thereby facilitating the control of the quantum wire in shape and size.

However, most of the so far published quantum wire laser diodes fabrication methods require subsequent processes, such as an ion-implantation into a non-active layer, and a deposition of an insulation layer, after a laser structure growth for thereby increasing the current flow into the active layer, so that the subsequent processes cause the laser diode fabrication to become complicated and further deteriorate the laser diode characteristics resulting from a decreased optical confinement coefficient within the active layer.

SUMMARY OF THE INVENTION

Accordingly, it is an object of the present invention to provide a quantum wire laser diode fabrication method which employs a current blocking layer formed outside a V-grooved pattern to interrupt a current from flowing thereinto, for thereby enabling the current to only flow into an active layer, without requiring any subsequent processes which allows the current to efficiently flow the active layer, and further obtaining the low threshold current.

To achieve the above-described object, there is provided a quantum wire laser diode fabrication method according to the present invention which includes the steps of forming a buffer layer and an epitaxial layer sequentially on a substrate, forming the V-grooved pattern into the epitaxial layer to form a current blocking layer, and forming another buffer layer thereon, forming a quantum wire laser structure on the V-grooved pattern, forming a contact layer, and forming an electrode.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE INVENTION

With reference to the accompanying drawings, the quantum wire laser diode according to the present invention will be described.

Figure 1:
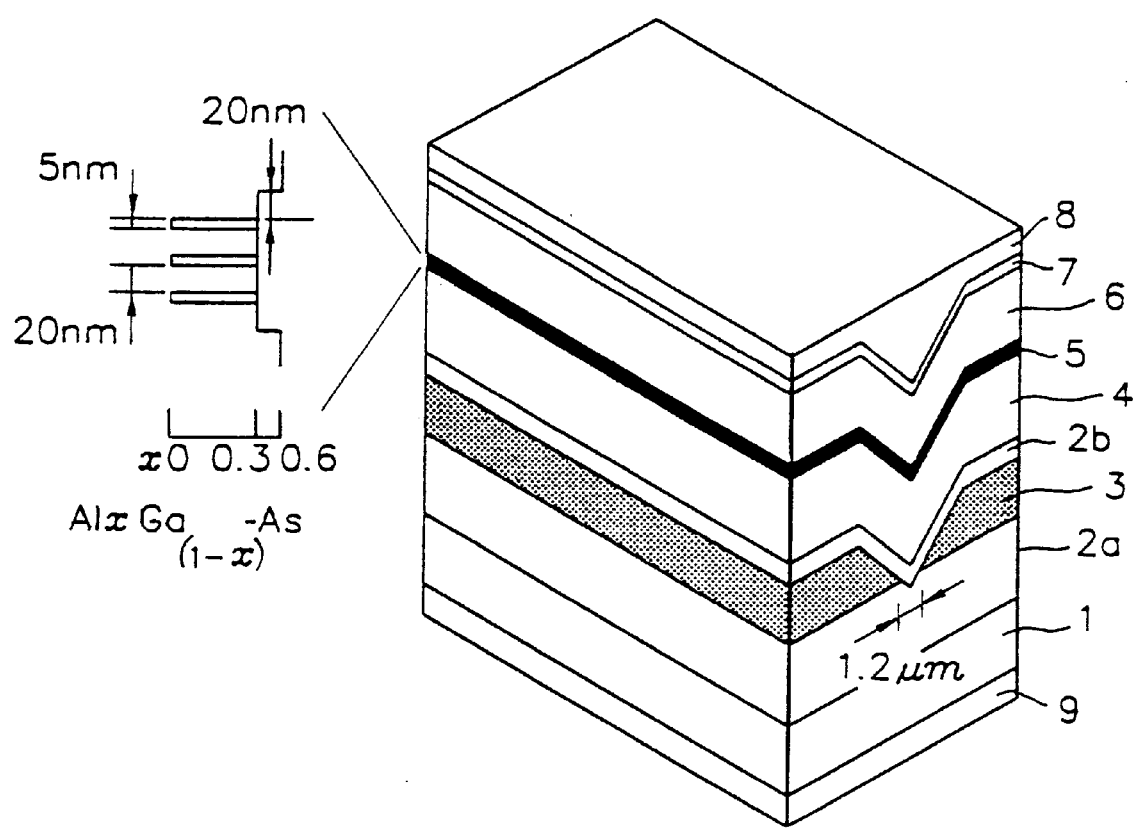
FIG. 1 is a cross-sectional perspective view illustrating a quantum wire laser diode according to the present invention.

First, as shown in FIG. 1, on an n-type GaAs substrate 1, there is formed by MOCVD an n-type GaAs buffer layer 2a on which is subsequently formed a p-type GaAs epitaxial layer 3 serving as a current blocking layer.

Using a photolithographic method and a wet etching, a V-grooved pattern is formed into the p-type GaAs epitaxial layer 3. At this time, the wet etching is carried out to further etch the n-type GaAs buffer layer 2a by about 1.2 $\mu$m in width so as to house therein a lower and central tip portion of the V-grooved pattern. Here, the wet etching for forming the V-grooved pattern employs a ratio of an etching solution of 1 $H_2SO_4$:8 $H_2O_2$:40 $H_2O$.

Likewise, the V-grooved pattern is formed down into the n-type GaAs buffer layer 2a, so that a p-n connected current blocking layer can be formed outwardly from the V-grooved pattern, for thereby preventing a current from flowing outside the V-grooved pattern.

Then, a quantum wire laser sample is put into an epitaxial layer growing device employed to form an n-type GaAs buffer layer 2b of 300 nm in thickness. In continuation of the above process, there are sequentially formed an n-type AlGaAs confinement layer 4 of 1.2 $\mu$m in thickness; several GaAs active layers 5 of 5 nm-thicknesses, respectively, and each of the active layers 5 are sandwiched between walls of $Al_{0.25}Ga_{0.75}As$ with a thickness of 20 nm; and a p-type $Al_{0.5}Ga_{0.5}As$ confinement layer 6 of 1 $\mu$m in thickness, for thereby forming a laser structure of several GaAs quantum wires along the V-grooved pattern. The epitaxial layer growth is completed by forming a p-type contact layer 7 on the confinement layer 6.

After the completion of the epitaxial layer growth, a portion of the substrate 1 is ground by lapping to obtain a sample thickness of 100 $\mu$m. Then, a Mo/Au and a AuGe/Ni/Au are respectively deposited on the p-type contact layer 7 and an underside of the substrate 1 using an electron beam deposition apparatus to form a p-type electrode 8 on the p-type contact layer 7 and an n-type electrode 9 on the base of the confinement layer 6, for thereby completing the quantum wire laser diode fabrication.

Figure 2:
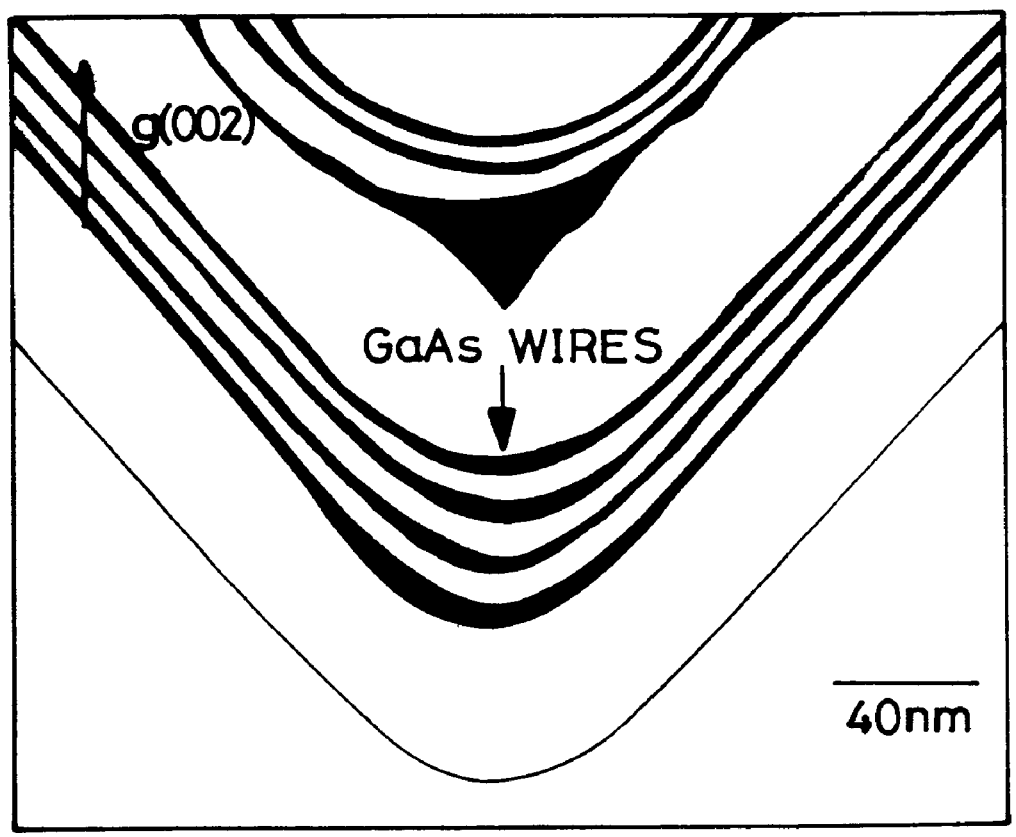
FIG. 2 is a cross-sectional picture of the quantum wire laser diode according to the present invention, taken by a transmission electron microscope.

FIG. 2 is a cross-sectional picture taken by a transmission electron microscope (TEM) with regard to the completed structure of the quantum wire laser diode according to the present invention, and shows three GaAs quantum wires stacked perpendicular to the quantum wire laser diode. Here, each of the quantum wires is about 7 nm in thickness and about 80 nm in width, which satisfies the desired value of the quantum wires by a user.

Figure 3:
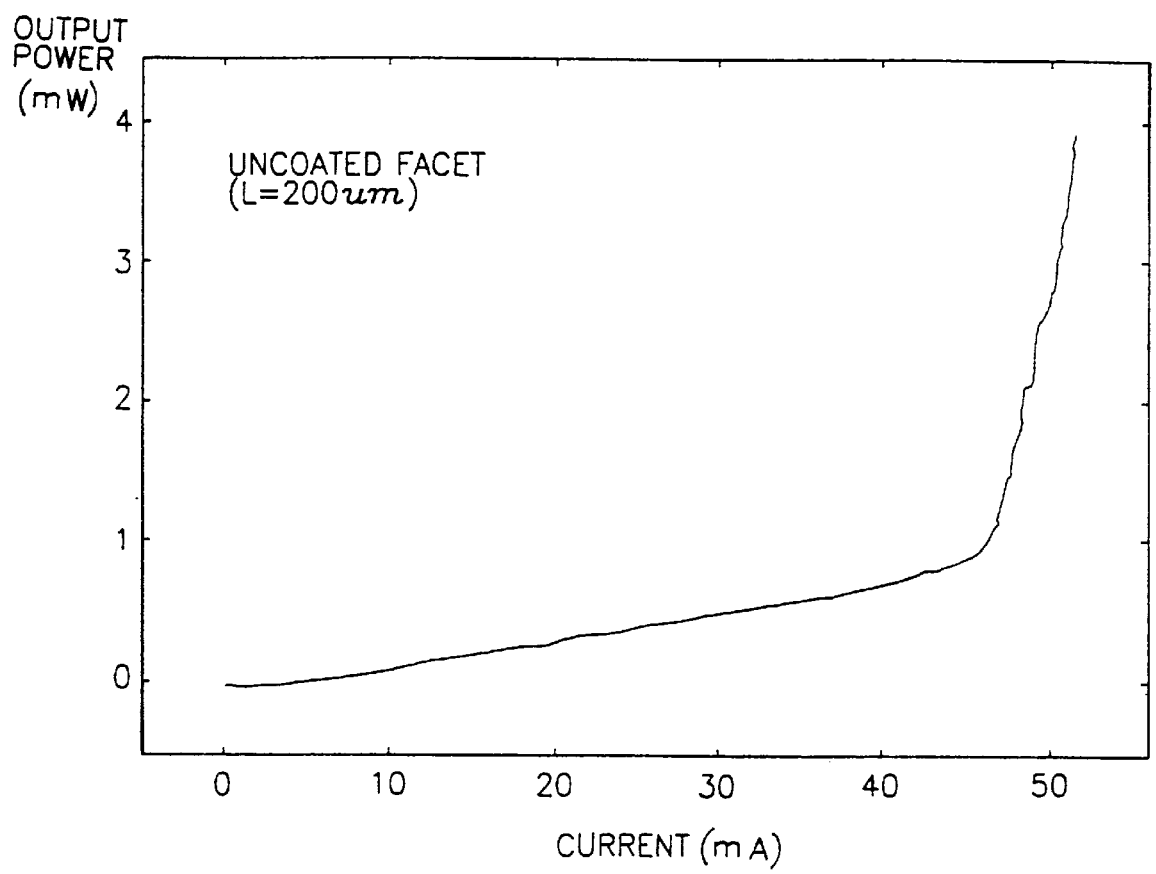
FIG. 3 is a graph illustrating output characteristics of the quantum wire laser diode according to the present invention.

Also, FIG. 3 is a graph illustrating output characteristics with regard to the current flow into the completed quantum wire laser diode, and the results are obtained by measuring the sample having a quantum laser diode cavity of 200 $\mu$m in length under the room atmosphere. As shown therein, about an output of 4 mW was obtained from a threshold current of 45 mA and a current of 50 mA, which denotes a differential quantum efficiency of about 60%.

Meanwhile, the center wave length in a laser oscillation spectrum becomes about 826 nm which closely corresponds to a theoretical value of 820 nm with regard to an oscillation wave length considering the size of the quantum wire obtained in FIG. 2.

As described above, the present invention employs a current blocking layer formed outside the V-grooved pattern to block the current from flowing thereinto, for thereby enabling the current to only flow into the active layer, without requiring any subsequent processes which allow the current to efficiently flow into the active layer, and further obtaining the low threshold current.

What is claimed is:

1. A quantum wire laser diode fabrication method, comprising the steps of:

forming a buffer layer and an epitaxial layer sequentially on a substrate;

forming a V-grooved pattern into the epitaxial layer to form a current blocking layer, and forming another buffer layer thereon;

forming a quantum wire laser structure on the V-grooved pattern;

forming a contact layer; and forming an electrode.

2. The fabrication method of claim 1, wherein the epitaxial layer is formed of a conductive type different from that of the substrate.

3. The fabrication method of claim 1, wherein the V-grooved pattern of the epitaxial layer is formed using a photolithographic method and a wet etching method.

4. The fabrication method of claim 1, wherein the wet etching for forming the V-grooved pattern of the epitaxial layer is carried out using an etching solution admixed with $H_2SO_4$, $H_2O_2$, and $H_2O$ under a ratio of 1:8:40.

5. The fabrication method of claim 1, wherein the V-grooved pattern is formed into the buffer layer so as to form the current blocking layer outside the V-grooved pattern.

6. The fabrication method of claim 5, wherein the V-grooved pattern is formed into the buffer layer by about 1.2 $\mu$m in width therearound.

7. The fabrication method of claim 1, wherein a quantum wire laser structure of AlGaAS/GaAS is formed on the substrate having the V-grooved pattern formed thereinto by use of a chemical vapor deposition method.

* * * * *